(12) United States Patent
Sato et al.

(10) Patent No.: US 10,593,714 B2
(45) Date of Patent: Mar. 17, 2020

(54) IMAGING DEVICE

(71) Applicant: Panasonic Intellectual Property Management Co., Ltd., Osaka (JP)

(72) Inventors: Yoshihiro Sato, Osaka (JP); Junji Hirase, Osaka (JP); Yoshinori Takami, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/033,723

(22) Filed: Jul. 12, 2018

(65) Prior Publication Data

US 2019/0027524 A1  Jan. 24, 2019

(30) Foreign Application Priority Data

Jul. 24, 2017 (JP) .................. 2017-142851
Mar. 1, 2018 (JP) .................. 2018-036117

(51) Int. Cl.
*H01L 27/146* (2006.01)
*H01L 27/30* (2006.01)
*H04N 5/378* (2011.01)

(52) U.S. Cl.
CPC .. *H01L 27/14612* (2013.01); *H01L 27/14603* (2013.01); *H01L 27/14636* (2013.01);
(Continued)

(58) Field of Classification Search
CPC ......... H01L 27/14612; H01L 27/14603; H01L 27/14636; H01L 27/14643; H01L 27/14665; H01L 27/307; H04N 5/378
See application file for complete search history.

(56) References Cited

U.S. PATENT DOCUMENTS 9,711,558 B2   7/2017 Sato et al.
2005/0023580 A1   2/2005 Rhodes
(Continued)

FOREIGN PATENT DOCUMENTS

JP   2016-063216   4/2016
WO   2012/147302   11/2012
(Continued)

OTHER PUBLICATIONS

The Extended European Search Report dated Jan. 23, 2019 for the related European Patent Application No. 18184142.0.

*Primary Examiner* — Yosef Gebreyesus
(74) *Attorney, Agent, or Firm* — McDermott Will & Emery LLP

(57) ABSTRACT

An imaging device includes: a pixel that includes a semiconductor substrate including a first diffusion region containing a first impurity of a first conductivity type, and a second diffusion region containing a second impurity of the first conductivity type, a concentration of the first impurity in the first diffusion region being less than a concentration of the second impurity in the second diffusion region, an area of the first diffusion region being less than an area of the second diffusion region in a plan view, a photoelectric converter configured to convert light into charges, and a first transistor including a source and a drain, the first diffusion region functioning as one of the source and the drain, the second diffusion region functioning as the other of the source and the drain, the first diffusion region being configured to store at least a part of the charges.

13 Claims, 9 Drawing Sheets

(52) U.S. Cl.
CPC .. *H01L 27/14643* (2013.01); *H01L 27/14665* (2013.01); *H01L 27/307* (2013.01); *H04N 5/378* (2013.01)

(56) References Cited

U.S. PATENT DOCUMENTS

| | | | |
|---|---|---|---|
| 2006/0022223 A1* | 2/2006 | Kumesawa | H01L 27/14601 257/225 |
| 2014/0043510 A1 | 2/2014 | Kasuga et al. | |
| 2014/0077067 A1 | 3/2014 | Matsunaga | |
| 2015/0109503 A1 | 4/2015 | Mori et al. | |
| 2015/0123180 A1 | 5/2015 | Sato et al. | |
| 2016/0079297 A1* | 3/2016 | Sato | H01L 27/14643 257/291 |
| 2016/0111469 A1* | 4/2016 | Suzuki | H01L 27/14603 257/225 |
| 2017/0162624 A1* | 6/2017 | Hatano | H01L 27/14806 |

FOREIGN PATENT DOCUMENTS

| | | |
|---|---|---|
| WO | 2012/160802 | 11/2012 |
| WO | 2014/002330 | 1/2014 |
| WO | 2014/002361 | 1/2014 |

\* cited by examiner

IMAGING DEVICE

BACKGROUND

1. Technical Field

The present disclosure relates to an imaging device.

2. Description of the Related Art

Charge-coupled device (CCD) image sensors and complementary metal oxide semiconductor (CMOS) image sensors are widely used in digital cameras and the like. As is well known, such image sensors each include a photodiode formed in a semiconductor substrate.

A structure in which a photoelectric converter having a photoelectric conversion layer is arranged above a semiconductor substrate has been proposed (International Publications Nos. 2014/002330 and 2012/147302, for example). An imaging device having such a structure may be called a stacked imaging device. In a stacked imaging device, charges generated through photoelectric conversion are stored in a charge storage region (called a floating diffusion (FD)). A signal corresponding to the number of charges stored in the charge storage region is read out via a CCD circuit or a CMOS circuit formed in a semiconductor substrate.

SUMMARY

In a stacked imaging device, a leakage current from or to a charge storage region (hereinafter also called a "dark current") may cause a deterioration in an obtained image. It is beneficial to reduce such a leakage current.

In one general aspect, the techniques disclosed here feature an imaging device including: a pixel that includes a semiconductor substrate including a first diffusion region containing a first impurity of a first conductivity type, and a second diffusion region containing a second impurity of the first conductivity type, a concentration of the first impurity in the first diffusion region being less than a concentration of the second impurity in the second diffusion region, an area of the first diffusion region being less than an area of the second diffusion region in a plan view, a photoelectric converter configured to convert light into charges, and a first transistor including a first source and a first drain, the first diffusion region functioning as one of the first source and the first drain, the second diffusion region functioning as the other of the first source and the first drain, the first diffusion region being configured to store at least a part of the charges.

It should be noted that general or specific embodiments may be implemented as an element, a device, a module, a system, a method, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
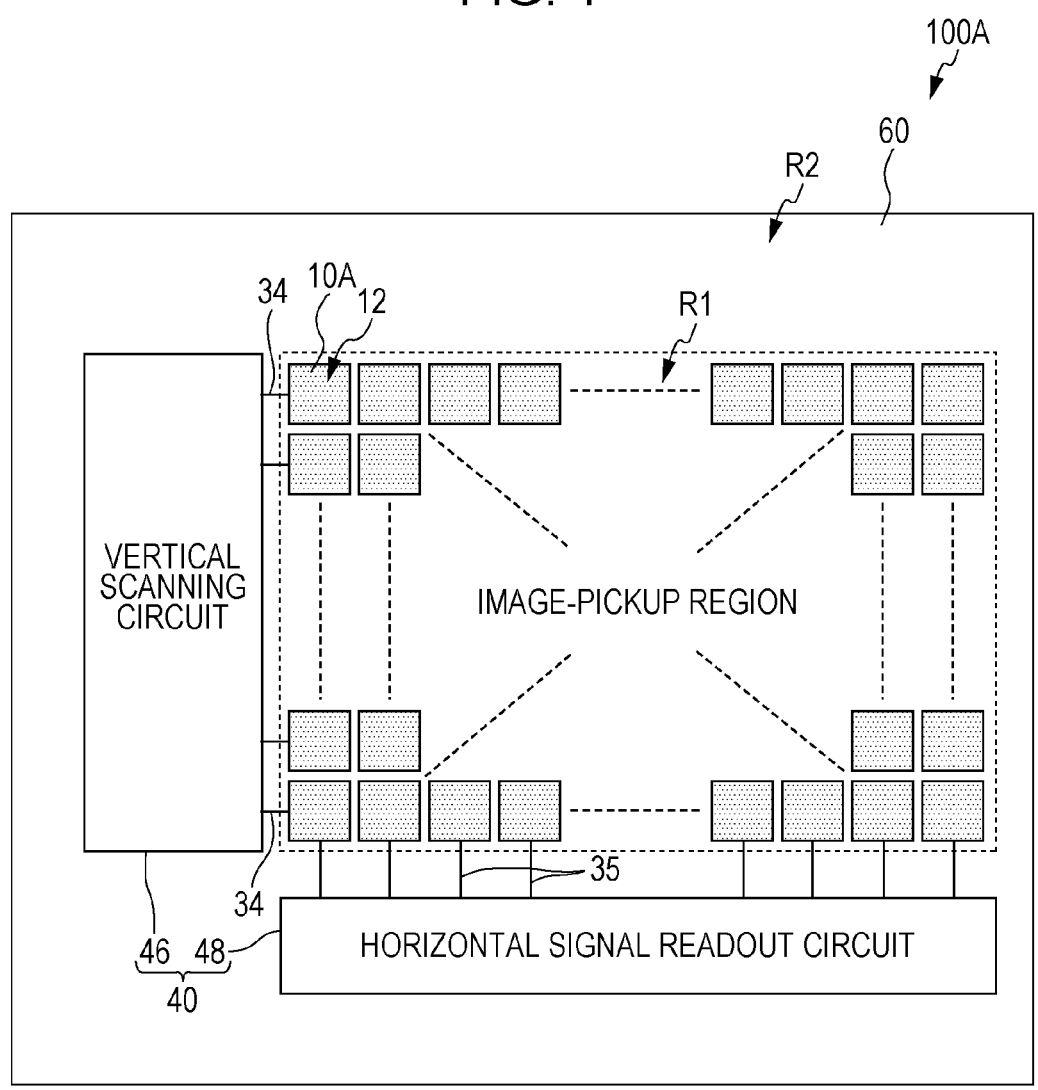
FIG. 1 is a view of a configuration of an imaging device according to an embodiment.

An overview of an aspect of the present disclosure is as follows.

[Item 1]

An imaging device including:
 a pixel that includes
  a semiconductor substrate including
   a first diffusion region containing a first impurity of a first conductivity type, and
   a second diffusion region containing a second impurity of the first conductivity type, a concentration of the first impurity in the first diffusion region being less than a concentration of the second impurity in the second diffusion region, an area of the first diffusion region being less than an area of the second diffusion region in a plan view,
  a photoelectric converter configured to convert light into charges, and
  a first transistor including a first source and a first drain, the first diffusion region functioning as one of the first source and the first drain, the second diffusion region functioning as the other of the first source and the first drain, the first diffusion region being configured to store at least a part of the charges.

As described above, the concentration of the impurity of the first conductivity type contained in the first diffusion region is less than an impurity concentration in a different diffusion region containing the impurity of the first conductivity type inside the pixel. Since this reduces a junction concentration at a junction between the first diffusion region and the semiconductor substrate, a leakage current in the first diffusion region is reduced.

Additionally, an area of a depletion layer which is formed at the junction between the first diffusion region and the semiconductor substrate, especially a depletion layer at a surface of the semiconductor substrate, can be reduced. Since a crystal defect is large near the surface of the semiconductor substrate, a depletion layer formed near the surface increases a leakage current. It is thus possible to reduce a leakage current by reducing an area of a depletion layer at the surface of the semiconductor substrate.

[Item 2]

The imaging device according to Item 1, in which
 the semiconductor substrate includes a third diffusion region containing a third impurity of the first conductivity type, the pixel includes a second transistor including a second source and a second drain, the third diffusion region functioning as one of the second source and the second drain, and the concentration of the first impurity in the first diffusion region is less than a concentration of the third impurity in the third diffusion region.

[Item 3]

The imaging device according to Item 1 or 2, in which the pixel includes a third transistor including a third source and a third drain, the first diffusion region functioning as one of the second source and the second drain.

[Item 4]

The imaging device according to Item 1, in which
the first transistor includes a gate electrode, and
an area of a first portion of the first diffusion region is less than an area of a second portion of the second diffusion region in the plan view, the first portion being a portion of the first diffusion region not overlapping with the gate electrode in the plan view, the second portion being a portion of the second diffusion region not overlapping with the gate electrode in the plan view.

[Item 5]

The imaging device according to any one of Items 1 to 4, in which
the pixel includes
a first plug connected to a first portion of the first diffusion region, and
a second plug connected to a second portion of the second diffusion region,
the first transistor includes a gate electrode, and
a distance between the first portion and the gate electrode is less than a distance between the second portion and the gate electrode in the plan view.

Since the above-described configuration shortens a distance from the first plug of the first diffusion region to the gate electrode of the first transistor, a rise in a resistance value of the first diffusion region can be reduced.

[Item 6]

The imaging device according to any one of Items 1 to 5, in which
the semiconductor substrate includes a fourth diffusion region containing a fourth impurity of a second conductivity type different from the first conductivity type,
the pixel includes a fourth transistor different from the first transistor and an isolation region isolating the first transistor from the second transistor, the third diffusion region functioning as the isolation region, and
the third diffusion region is not in contact with the first diffusion region on a surface of the semiconductor substrate.

As described above, since the first diffusion region containing the impurity of the first conductivity type and the isolation region containing the impurity of the second conductivity type different from the first conductivity type are not in contact with each other at the surface of the semiconductor substrate where a leakage current is most likely to be generated, a leakage current at a junction at the surface of the semiconductor substrate can be reduced.

[Item 7]

The imaging device according to any one of Items 1 to 6, in which
the semiconductor substrate contains a fifth impurity of a second conductivity type different from the first conductivity type, the concentration of the first impurity in the first diffusion region is $1\times10^{16}$ atoms/cm$^3$ or more and $5\times10^{16}$ atoms/cm$^3$ or less, and a concentration of the fifth impurity in a portion of the semiconductor substrate is $1\times10^{16}$ atoms/cm$^3$ or more and $5\times10^{16}$ atoms/cm$^3$ or less, the portion being adjacent to the first diffusion region.

As described above, a rise in electric field strength at a junction between the first diffusion region and the semiconductor substrate can be curbed by reducing the concentrations of the impurities of the first conductivity type and of the second conductivity type. This allows a reduction in leakage current.

[Item 8]

The imaging device according to any one of Items 1 to 7, in which the first diffusion region is circular in the plan view.

Since the above-described configuration reduces an area of the first diffusion region at a surface of the semiconductor substrate, an area of a depletion layer which is formed at a junction at the surface of the semiconductor substrate can be reduced. This allows a reduction in leakage current.

[Item 9]

An imaging device including:
a pixel that includes
a semiconductor substrate including
a first diffusion region containing a first impurity of a first conductivity type, and
a second diffusion region containing a second impurity of the first conductivity type, a concentration of the first impurity in the first diffusion region being less than a concentration of the second impurity in the second diffusion region,
a photoelectric converter configured to convert light into charges,
a first transistor including a gate electrode, a first source and a first drain, the first diffusion region functioning as one of the first source and the first drain, the second diffusion region functioning as the other of the source and the drain, the first diffusion region being configured to store at least a part of the charges,
a first plug connected to a first portion of the first diffusion region, and
a second plug connected to a second portion of the second diffusion region, wherein
a distance between the first portion and the gate electrode is less than a distance between the second portion and the gate electrode in a plan view.

An embodiment of the present disclosure will be described below in detail with reference to the drawings. Note that the embodiment described below is a comprehensive or specific illustration. Numerical values, shapes, materials, constituent elements, the arrangement and connection forms of the constituent elements, steps, the order of the steps, and the like illustrated in the embodiment below are merely illustrative, and are not intended to limit the present disclosure. Various aspects described in the present specification can be combined as long as there is no contradiction. Among the constituent elements in the embodiment below, those not described in an independent claim representing a top-level concept will be described as optional constituent elements. In the drawings, constituent elements having substantially the same functions are denoted by the same reference characters, and a redundant description thereof may be omitted or simplified.

Various elements shown in the drawings are only schematically shown for understanding the present disclosure, and dimensional ratios and appearance may differ from the reality.

Note that a light-receiving side of an imaging device and a side opposite to the light-receiving side are an upper side and a lower side, respectively, in the present specification. Similarly, in each element, a surface facing the light-receiving side of the imaging device and a surface facing the side opposite to the light-receiving side are an upper surface and a lower surface, respectively. Note that terms, such as "upper side", "lower side", "upper surface", and "lower surface", are just used to specify the arrangement of members relative to each other and are not intended to limit the posture of the imaging device when used.

(Embodiment)

FIG. 1 is a view of a configuration of an imaging device according to the present embodiment. As shown in FIG. 1, an imaging device 100A according to the present embodiment includes a plurality of pixels 10A and peripheral circuits 40 which are formed on a semiconductor substrate 60. Each pixel 10A includes a photoelectric converter 12 which is arranged on an upper side of the semiconductor substrate 60. That is, the stacked imaging device 100A will be described as an example of an imaging device according to the present disclosure.

In the example shown in FIG. 1, the pixels 10A are arranged in a matrix with m rows and n columns. The symbols m and n are integers not less than 2. The pixels 10A are arrayed, for example, in a two-dimensional manner on the semiconductor substrate 60 to form an image pickup region R1. As described above, each pixel 10A includes the photoelectric converter 12 arranged on the upper side of the semiconductor substrate 60. For this reason, the image pickup region R1 is defined as a region covered with the photoelectric converters 12 of the semiconductor substrate 60. Note that although the photoelectric converters 12 of the pixels 10A are illustrated to be spaced from each other in FIG. 1 for ease of explanation, the photoelectric converters 12 of the plurality of pixels 10A may be arranged without space between each other on the semiconductor substrate 60.

The number and arrangement of the pixels 10A are not limited to those in the shown example. For example, the number of pixels 10A included in the imaging device 100A may be one. Although the center of each pixel 10A is located on a lattice point of a tetragonal lattice in the present example, the pixels 10A may not be arranged in that manner. For example, the plurality of pixels 10A may be arranged such that the centers thereof are located on lattice points of a triangular lattice, a hexagonal lattice, or the like. If the pixels 10A are arrayed in a one-dimensional manner, the imaging device 100A can be used as a line sensor.

In the configuration illustrated in FIG. 1, the peripheral circuits 40 include a vertical scanning circuit (also called a "row scanning circuit") 46 and a horizontal signal readout circuit (also called a "column scanning circuit") 48. The vertical scanning circuit 46 has connections to address signal lines 34 which are provided so as to correspond to rows of the plurality of pixels 10A. The horizontal signal readout circuit 48 has connections to vertical signal lines 35 which are provided so as to correspond to columns of the plurality of pixels 10A. As schematically shown in FIG. 1, the circuits are arranged in a peripheral region R2 outside the image pickup region R1. The peripheral circuits 40 may further include a signal processing circuit, an output circuit, a control circuit, a power supply which supplies a predetermined voltage to each pixel 10A, and the like. A part of the peripheral circuits 40 may be arranged on a separate substrate different from the semiconductor substrate 60 having the pixels 10A formed thereon.

Figure 2:
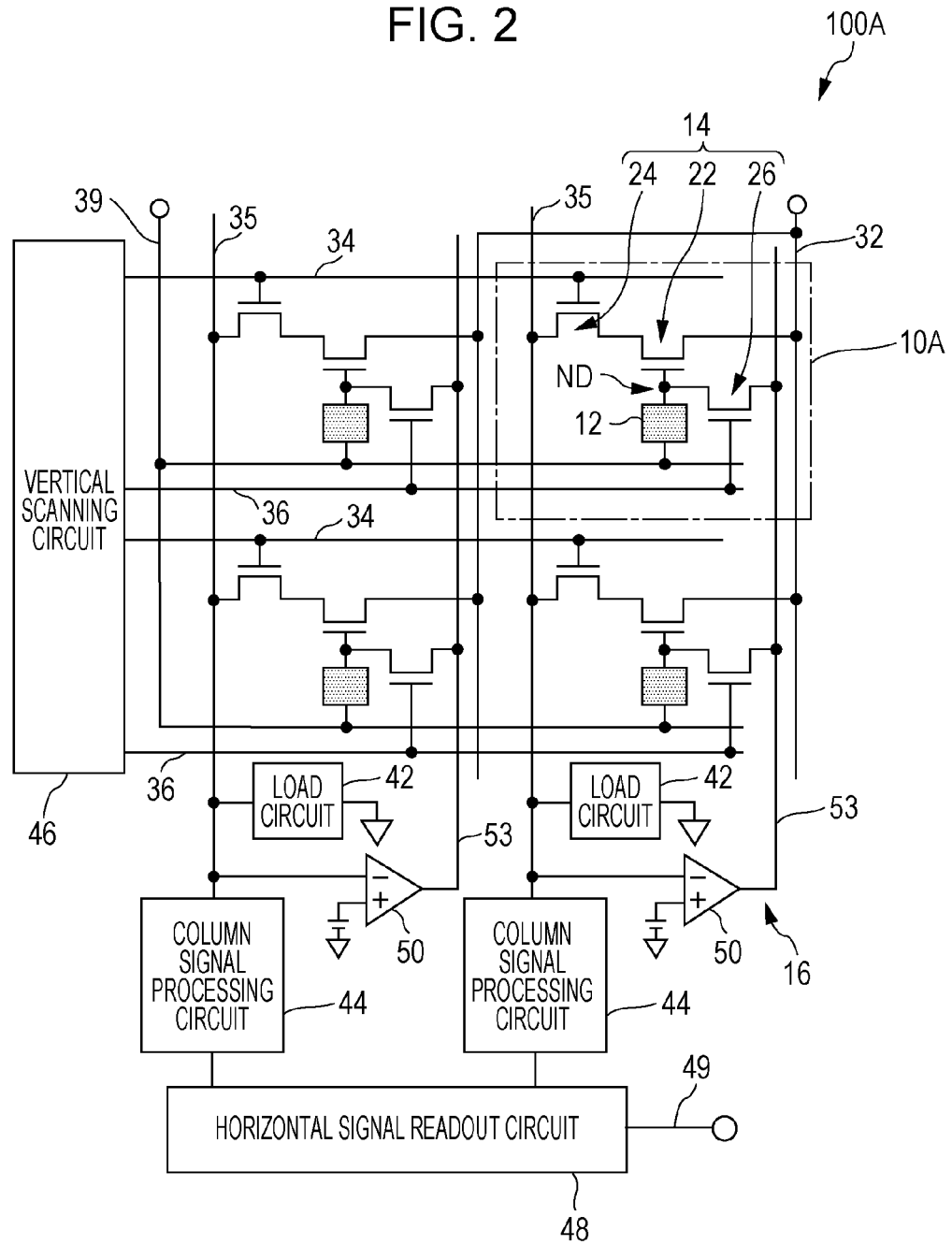
FIG. 2 is a diagram showing a circuit configuration of the imaging device according to the embodiment.

FIG. 2 is a diagram showing a circuit configuration of the imaging device 100A according to the embodiment. In FIG. 2, four pixels 10A arrayed in two rows and two columns of the plurality of pixels 10A shown in FIG. 1 are shown to avoid complexity.

The photoelectric converter 12 of each pixel 10A receives incident light and generates positive and negative charges (typically a hole-electron pair). The photoelectric converter 12 of each pixel 10A has a connection to a storage control line 39, and a predetermined voltage is applied to the storage control line 39 when the imaging device 100A is in operation. With the application of the predetermined voltage to the storage control line 39, one of the positive and negative charges generated through photoelectric conversion can be selectively stored in a charge storage region. A case where a positive one of positive and negative charges generated through photoelectric conversion is used as a signal charge will be illustrated below as an example.

Each pixel 10A includes a signal detection circuit 14 which is electrically connected to the photoelectric converter 12. In the configuration illustrated in FIG. 2, the signal detection circuit 14 includes an amplification transistor 22 (also called a "readout transistor") and a reset transistor 26. In the present example, the signal detection circuit 14 further includes an address transistor (also called a "row selection transistor") 24. As will be described later in detail with reference to the drawings, the amplification transistor 22, the reset transistor 26, and the address transistor 24 of the signal detection circuit 14 are typically field effect transistors (FETs) which are formed on the semiconductor substrate 60 supporting the photoelectric converter 12. An example using an N-channel metal oxide semiconductor (MOS) as a transistor will be described below unless otherwise noted. Note that which one of two diffusion layers of an FET corresponds to a source or a drain is determined by the polarity of the FET and the level of a potential at a time point in question. For this reason, which one serves as the source and which one serves as the drain may vary in accordance with an operating condition of the FET.

As schematically shown in FIG. 2, a gate of the amplification transistor 22 is electrically connected to the photoelectric converter 12. Charges generated by the photoelectric converter 12 are stored in a charge storage node (also called a "floating diffusion node") ND. Note that the charge storage node ND includes the charge storage region, the gate of the amplification transistor 22, and a lower electrode of the photoelectric converter 12, and wiring that electrically connect therebetween.

A drain of the amplification transistor 22 is connected to a piece 32 of power-supply wiring (also called a source follower power supply) which supplies a predetermined power-supply voltage VDD (about 3.3 V, for example) to each pixel 10A when the imaging device 100A is in operation. In other words, the amplification transistor 22 outputs a signal voltage corresponding to the number of signal charges generated by the photoelectric converter 12. A source of the amplification transistor 22 is connected to a drain of the address transistor 24.

The vertical signal line 35 is connected to a source of the address transistor 24. As shown in FIG. 2, the vertical signal line 35 is provided for each column of the plurality of pixels 10A, and a load circuit 42 and a column signal processing circuit (also called a "row signal storage circuit") 44 are connected to each vertical signal line 35. The load circuit 42 together with the amplification transistor 22 forms a source follower circuit.

The address signal line 34 is connected to a gate of the address transistor 24. The address signal line 34 is provided for each row of the plurality of pixels 10A. The address signal line 34 is connected to the vertical scanning circuit 46, and the vertical scanning circuit 46 applies a row selection signal for controlling turn-on and turn-off of the address transistor 24 to the address signal line 34. Scanning in a vertical direction (column direction) is performed for a row to be read out, and the row to be read out is selected. The vertical scanning circuit 46 can read out outputs from the amplification transistors 22 of the selected pixels 10A onto the corresponding vertical signal lines 35 by controlling turn-on and turn-off of the address transistors 24 via the address signal line 34. The arrangement of the address transistor 24 is not limited to that in the example shown in FIG. 2, and the address transistor 24 may be arranged between the drain of the amplification transistor 22 and the piece 32 of power-supply wiring.

A signal voltage from the pixel 10A which is output onto the vertical signal line 35 via the address transistor 24 is input to a corresponding one of the plurality of column signal processing circuits 44. The column signal processing circuit 44 is provided for each column of the plurality of pixels 10A so as to correspond to the vertical signal line 35. The column signal processing circuit 44 and the load circuit 42 can be a part of the peripheral circuits 40 described above.

The column signal processing circuit 44 performs noise suppression signal processing typified by correlated double sampling, analog-digital conversion (AD conversion), and the like. The column signal processing circuit 44 is connected to the horizontal signal readout circuit 48. The horizontal signal readout circuit 48 sequentially reads out signals from the plurality of column signal processing circuit 44 onto a horizontal common signal line 49.

In the configuration illustrated in FIG. 2, the signal detection circuit 14 includes the reset transistor 26, a drain of which is connected to the charge storage node ND. A reset signal line 36 which has a connection to the vertical scanning circuit 46 is connected to a gate of the reset transistor 26. The reset signal line 36 is provided for each row of the plurality of pixels 10A, like the address signal line 34. The vertical scanning circuit 46 can select the pixels 10A as objects to be reset on a row-by-row basis by applying a row selection signal to the address signal line 34. Additionally, the vertical scanning circuit 46 can turn on the reset transistors 26 in a selected row by applying a reset signal for controlling turn-on and turn-off of the reset transistor 26 to the gates of the reset transistors 26 via the reset signal line 36. Turn-on of the reset transistor 26 resets a potential of the charge storage node ND.

In the present example, a source of the reset transistor 26 is connected to one of feedback lines 53. The feedback line 53 is provided for each column of the plurality of pixels 10A. That is, in the example, a voltage of the feedback line 53 is supplied to the charge storage node ND as a reset voltage for initializing charges in the photoelectric converter 12. The feedback line 53 is connected to an output terminal of a corresponding one of inverting amplifiers 50. The inverting amplifier 50 is provided for each column of the plurality of pixels 10A. The inverting amplifier 50 can be a part of the peripheral circuits 40 described above.

Focus on one of the columns of the plurality of pixels 10A. As shown in FIG. 2, an inverting input terminal of the inverting amplifier 50 is connected to the vertical signal line 35 in the column. The output terminal of the inverting amplifier 50 and one or more pixels 10A in the column are connected via the feedback line 53. When the imaging device 100A is in operation, a predetermined voltage Vref (a positive voltage of 1 V or a positive voltage close to 1 V, for example) is supplied to a noninverting input terminal of the inverting amplifier 50. One of one or more pixels 10A in the column is selected, and the address transistor 24 and the reset transistor 26 are turned on, which allows formation of a feedback path for negatively feeding back an output from the pixel 10A. With the formation of the feedback path, a voltage of the vertical signal line 35 converges on the voltage Vref input to the noninverting input terminal of the inverting amplifier 50. In other words, the formation of the feedback path resets a voltage of the charge storage node ND to a voltage which sets the voltage of the vertical signal line 35 to the voltage Vref. A voltage of arbitrary magnitude within a range from the power-supply voltage (3.3 V, for example) to a ground voltage (0 V) can be used as the voltage Vref. The inverting amplifier 50 may be called a feedback amplifier. As described above, the imaging device 100A includes a feedback circuit 16 which includes the inverting amplifier 50 as a part of the feedback path.

As is well known, thermal noise called kTC noise is generated upon turn-on or turn-off of a transistor. Noise which is generated upon turn-on or turn-off of a reset transistor is called reset noise. Reset noise which is generated by turning off a reset transistor after resetting of a potential of a charge storage region may remain in the charge storage region before signal charge storage. The reset noise that is generated upon turn-off of the reset transistor can be reduced using feedback. Details of suppression of reset noise using feedback are described in International Publication No. 2012/147302. The disclosure of International Publication No. 2012/147302 is incorporated by reference herein in its entirety.

In the configuration illustrated in FIG. 2, the formation of a feedback path causes an AC component of thermal noise to be fed back to the source of the reset transistor 26. Since a feedback path is formed until immediately before the reset transistor 26 is turned off in the configuration illustrated in FIG. 2, reset noise which is generated upon the turn-off of the reset transistor 26 can be reduced.

Figure 3:
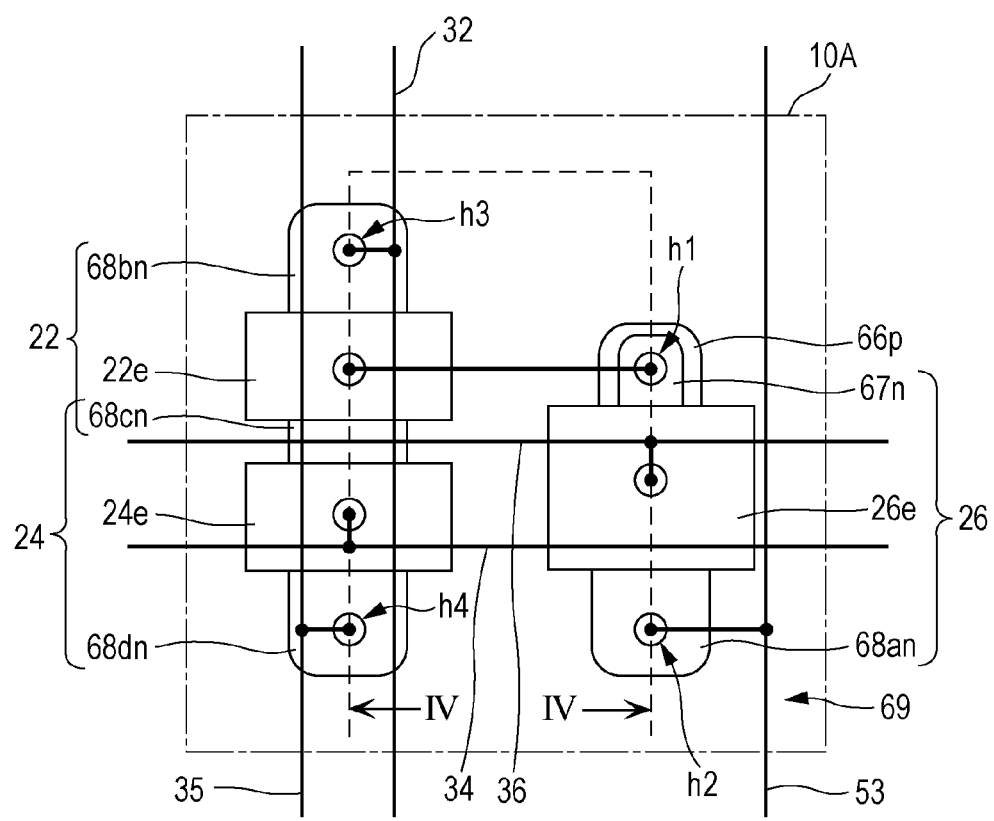
FIG. 3 is a plan view showing a layout inside a pixel according to the embodiment.
Figure 4:
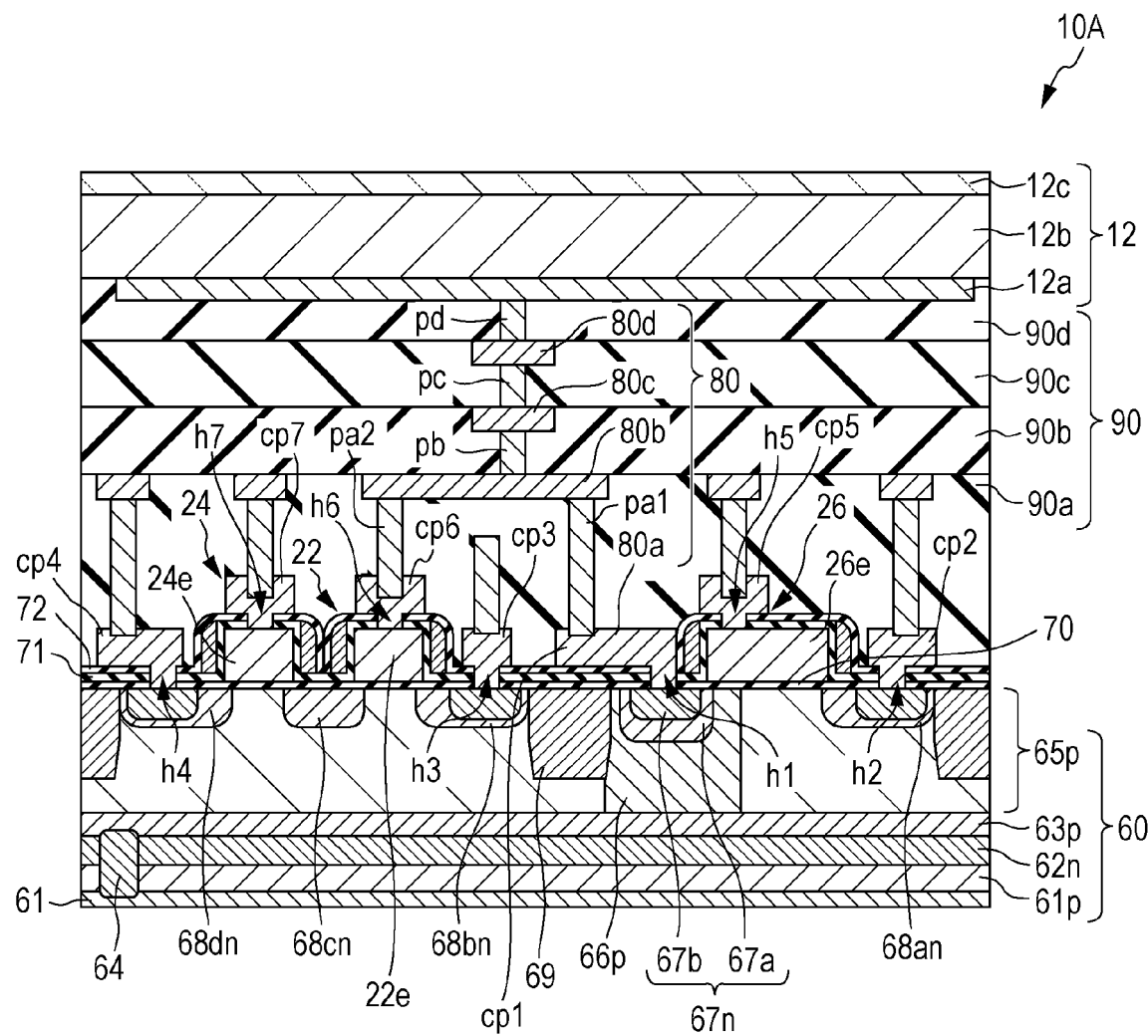
FIG. 4 is a schematic cross-sectional view of a device structure of the pixel according to the embodiment.

FIG. 3 is a plan view showing a layout inside the pixel 10A according to the embodiment. FIG. 4 is a schematic cross-sectional view of a device structure of the pixel 10A. FIG. 3 schematically shows the arrangement of elements (the amplification transistor 22, the address transistor 24, the reset transistor 26, and the like) formed on the semiconductor substrate 60 when the pixel 10A shown in FIG. 4 is viewed from a direction perpendicular to the semiconductor substrate 60. Here, the amplification transistor 22 and the address transistor 24 are arranged in a linear manner along a vertical direction of the sheet surface.

FIG. 4 is a schematic cross-sectional view of the device structure of the pixel 10A according to the embodiment. FIG. 4 is a cross-sectional view in a case where the pixel 10A is cut along line IV-IV in FIG. 3 and is developed in directions indicated by arrows.

Note that a first diffusion region 67n which is an n-type impurity region is a drain region of the reset transistor 26 and a charge storage region (FD) in FIGS. 3 and 4.

As shown in FIGS. 3 and 4, the pixel 10A in the imaging device 100A according to the present embodiment includes a first transistor (the reset transistor 26 here). The first transistor is located in the semiconductor substrate 60, contains an impurity of a first conductivity type (hereinafter referred to as n-type), and includes the first diffusion region 67n that stores charges obtained through conversion by the photoelectric converter 12 as one of a source and a drain and a second diffusion region 68an which is an n-type impurity region containing the n-type impurity as the other of the source and the drain. In the present embodiment, a concentration of the n-type impurity in the first diffusion region 67n is lower than that of the n-type impurity in the second diffusion region 68an.

The pixel 10A further includes a second transistor (the amplification transistor 22 or the address transistor 24 here) which is different from the reset transistor 26. The second transistor is located in the semiconductor substrate 60 and includes a third diffusion region (hereinafter referred to as a different n-type impurity region 68bn, 68cn, or 68dn) containing the n-type impurity as a source or a drain. In this case, the concentration of the n-type impurity in the first diffusion region 67n may be lower than concentrations of the n-type impurity in the different n-type impurity regions 68bn, 68cn, and 68dn (hereinafter expressed as 68bn to 68dn). The concentration of the n-type impurity in the first diffusion region 67n may be lower than at least 1/10 of the concentration of the n-type impurity in each of the second diffusion region 68an and the different n-type impurity regions 68bn to 68dn or lower than 1/15. Since this reduces a junction concentration at a junction between the first diffusion region 67n and the semiconductor substrate 60, electric field strength at the junction can be reduced. For this reason, a leakage current from or to the first diffusion region 67n that is a charge storage region can be reduced.

In the imaging device 100A according to the present embodiment, the semiconductor substrate 60 may contain an impurity of a second conductivity type (hereinafter referred to as p-type), and the concentration of the n-type impurity contained in the first diffusion region 67n and a concentration of the p-type impurity contained in a portion adjacent to the first diffusion region 67n of the semiconductor substrate 60 may be not less than $1 \times 10^{16}$ atoms/cm$^3$ and not more than $5 \times 10^{16}$ atoms/cm$^3$. This reduces the junction concentration between the first diffusion region 67n and the semiconductor substrate 60, which can curb a rise in electric field strength at the junction. For this reason, a leakage current at the junction can be reduced.

As schematically shown in FIG. 4, the pixel 10A schematically includes the semiconductor substrate 60, the photoelectric converter 12 that is arranged above the semiconductor substrate 60, and a wiring structure 80. The wiring structure 80 is arranged inside an interlayer insulating layer 90 which is formed between the photoelectric converter 12 and the semiconductor substrate 60 and includes a structure which electrically connects the amplification transistor 22 formed on the semiconductor substrate 60 to the photoelectric converter 12. The interlayer insulating layer 90 here has a layered structure including four insulating layers, insulating layers 90a, 90b, 90c, and 90d (hereinafter expressed as 90a to 90d). The wiring structure 80 includes four wiring layers, wiring layers 80a, 80b, 80c, and 80d (hereinafter expressed as 80a to 80d), and plugs pa1, pa2, pb, pc, and pd which are arranged between the wiring layers. The wiring layer 80a includes contact plugs cp1, cp2, cp3, cp4, cp5, cp6, and cp7 (hereinafter expressed as cp1 to cp7). It is apparent that the number of insulating layers in the interlayer insulating layer 90 and the number of wiring layers in the wiring structure 80 are not limited to those in the present example and may be arbitrarily set.

The photoelectric converter 12 is arranged on the interlayer insulating layer 90. The photoelectric converter 12 includes a pixel electrode 12a which is formed on the interlayer insulating layer 90, a transparent electrode 12c which faces the pixel electrode 12a, and a photoelectric conversion layer 12b which is arranged between the electrodes. The photoelectric conversion layer 12b of the photoelectric converter 12 is made of an organic material such as tin naphthalocyanine or an inorganic material such as amorphous silicon. The photoelectric conversion layer 12b receives light incident via the transparent electrode 12c and generates positive and negative charges through photoelectric conversion. The photoelectric conversion layer 12b is typically formed across the plurality of pixels 10A. The photoelectric conversion layer 12b may include a layer which is made of an organic material and a layer which is made of an inorganic material.

The transparent electrode 12c is made of a transparent conductive material, such as ITO, and is arranged on a light-receiving surface side of the photoelectric conversion layer 12b. The transparent electrode 12c is typically formed across the plurality of pixels 10A, like the photoelectric conversion layer 12b. Although not shown in FIG. 4, the transparent electrode 12c has a connection to the storage control line 39 described above. When the imaging device 100A is in operation, signal charges generated through photoelectric conversion can be collected by the pixel electrode 12a by controlling a potential of the storage control line 39 to make a potential of the transparent electrode 12c different from a potential of the pixel electrode 12a. For example, the potential of the storage control line 39 is controlled such that the potential of the transparent electrode 12c is higher than that of the pixel electrode 12a. More specifically, a positive voltage of, for example, about 10 V is applied to the storage control line 39. This allows the pixel electrode 12a to collect a hole of a hole-electron pair generated by the photoelectric conversion layer 12b. Signal charges collected by the pixel electrode 12a are stored in the first diffusion region 67n via the wiring structure 80.

The pixel electrode 12a is an electrode which is made of a polysilicon and the like given conductivity by being doped with a metal, such as aluminum or copper, a metal nitride, or an impurity. The pixel electrode 12a is electrically isolated from the pixel electrode 12a of the different adjacent pixel 10A by being spatially isolated from the pixel electrode 12a of the different pixel 10A.

The semiconductor substrate 60 includes a support substrate 61 and one or more semiconductor layers which are formed on the support substrate 61. A p-type silicon (Si) substrate is given here as an example of the support substrate 61. In the present example, the semiconductor substrate 60 includes a p-type semiconductor layer 61p on the support substrate 61, an n-type semiconductor layer 62n on the p-type semiconductor layer 61p, a p-type semiconductor layer 63p on the n-type semiconductor layer 62n, and a p-type semiconductor layer 65p on the p-type semiconductor layer 63p. The p-type semiconductor layer 63p is formed over an entire surface of the support substrate 61. The p-type semiconductor layer 65p includes a p-type impurity region 66p which is lower in impurity concentration than the p-type semiconductor layer 65p, the first diffusion region 67n formed inside the p-type impurity region 66p, the second diffusion region 68an, the n-type impurity regions 68bn to 68dn, and an element isolation region 69.

The p-type semiconductor layer 61p, the n-type semiconductor layer 62n, the p-type semiconductor layer 63p, and the p-type semiconductor layer 65p are each typically formed by implanting ions of an impurity into a semiconductor layer formed through epitaxial growth. Impurity concentrations in the p-type semiconductor layer 63p and the p-type semiconductor layer 65p are subequal to each other and are higher than an impurity concentration in the p-type semiconductor layer 61p. The n-type semiconductor layer 62n that is arranged between the p-type semiconductor layer 61p and the p-type semiconductor layer 63p inhibits minority carriers from flowing from the support substrate 61 or the peripheral circuits 40 into the first diffusion region 67n that is a charge storage region which stores signal charges. When the imaging device 100A is in operation, a potential of the n-type semiconductor layer 62n is controlled via a well contact (not shown) which is provided outside the image pickup region R1 (see FIG. 1).

In the present example, the semiconductor substrate 60 includes a p-type region 64 which is provided between the p-type semiconductor layer 63p and the support substrate 61 so as to penetrate the p-type semiconductor layer 61p and the n-type semiconductor layer 62n. The p-type region 64 has an impurity concentration higher than those of the p-type semiconductor layer 63p and the p-type semiconductor layer 65p and electrically connects the p-type semiconductor layer 63p to the support substrate 61. When the imaging device 100A is in operation, potentials of the p-type semiconductor layer 63p and the support substrate 61 are controlled via a substrate contact (not shown) which is provided outside the image pickup region R1. The p-type semiconductor layer 65p is arranged so as to be in contact with the p-type semiconductor layer 63p, which allows control of a potential of the p-type semiconductor layer 65p via the p-type semiconductor layer 63p when the imaging device 100A is in operation.

The amplification transistor 22, the address transistor 24, and the reset transistor 26 are formed on the semiconductor substrate 60. The reset transistor 26 includes the first diffusion region 67n and the second diffusion region 68an, an insulating layer 70 which is formed on the semiconductor substrate 60, and a gate electrode 26e on the insulating layer 70. The first diffusion region 67n and the second diffusion region 68an function as the drain region and a source region, respectively, of the reset transistor 26. The first diffusion region 67n functions as a charge storage region for temporarily storing signal charges generated by the photoelectric converter 12.

The amplification transistor 22 includes the n-type impurity regions 68bn and 68cn, a part of the insulating layer 70, and a gate electrode 22e on the insulating layer 70. The n-type impurity regions 68bn and 68cn function as a drain region and a source region, respectively, of the amplification transistor 22.

The element isolation region 69 is arranged between the n-type impurity region 68bn and the first diffusion region 67n. The element isolation region 69 is, for example, a p-type impurity diffusion region. The element isolation region 69 electrically isolates the amplification transistor 22 from the reset transistor 26.

As schematically shown in FIG. 4, the first diffusion region 67n is formed inside the p-type impurity region 66p, which causes the first diffusion region 67n and the element isolation region 69 to be arranged so as not to be in contact with each other. For example, if a p-type impurity layer is used as the element isolation region 69, contact of the first diffusion region 67n with the element isolation region 69 makes both a p-type impurity concentration and an n-type impurity concentration at a junction higher. For this reason, a leakage current due to the high junction concentration is likely to be generated around the junction between the first diffusion region 67n and the element isolation region 69. In other words, since the first diffusion region 67n and the element isolation region 69 are arranged so as not to be in contact with each other, even if a high-concentration p-type impurity layer is used as the element isolation region 69, it is possible to curb a rise in pn junction concentration and reduce a leakage current. Even in a case using a shallow trench isolation (STI) structure as the element isolation region 69, the first diffusion region 67n and the STI structure are desirably arranged so as not to be in contact with each other in order to reduce a leakage current due to a crystal defect at an STI side wall portion.

The element isolation region 69 is also arranged between adjacent pixels 10A to electrically isolate the signal detection circuits 14 of the pixels 10A. The element isolation region 69 here is provided around the amplification transistor 22 and the address transistor 24 as a set and around the reset transistor 26.

The address transistor 24 includes the n-type impurity regions 68cn and 68dn, a part of the insulating layer 70, and a gate electrode 24e on the insulating layer 70. In the present example, the address transistor 24 is electrically connected to the amplification transistor 22 by sharing the n-type impurity region 68cn with the amplification transistor 22. The n-type impurity region 68cn functions as a drain region of the address transistor 24 while the n-type impurity region 68dn functions as a source region of the address transistor 24.

In the present example, an insulating layer 72 is provided so as to cover the gate electrode 26e of the reset transistor 26, the gate electrode 22e of the amplification transistor 22, and the gate electrode 24e of the address transistor 24. The insulating layer 72 is, for example, a silicon oxide film. In the example, an insulating layer 71 intervenes between the insulating layer 72 and each of the gate electrodes 26e, 22e, and 24e. The insulating layer 71 is, for example, a silicon oxide film. The insulating layer 71 may have a layered structure including a plurality of insulating layers. Similarly, the insulating layer 72 can also have a layered structure including a plurality of insulating layers.

A layered structure of the insulating layers 72 and 71 has a plurality of contact holes. Here, contact holes h1 to h7 are provided in the insulating layers 72 and 71. The contact holes h1 to h4 are formed at respective positions overlapping with the first diffusion region 67n, the second diffusion region 68an, and the different n-type impurity regions 68bn and 68dn. The contact plugs cp1 to cp4 are arranged at positions corresponding to the contact holes h1 to h4, respectively. The contact holes h5 to h7 are formed at respective positions overlapping with the gate electrodes 26e, 22e, and 24e. The contact plugs cp5 to cp7 are arranged at positions corresponding to the contact holes h5 to h7, respectively.

In the configuration illustrated in FIG. 4, the wiring layer 80a is a layer including the contact plugs cp1 to cp7 and is typically a polysilicon layer doped with an n-type impurity. Of wiring layers included in the wiring structure 80, the wiring layer 80a is arranged nearest to the semiconductor substrate 60. The wiring layer 80b and the plugs pa1 and pa2 are arranged inside the insulating layer 90a. The plug pa1 connects the contact plug cp1 to the wiring layer 80b while the plug pa2 connects the contact plug cp6 to the wiring layer 80b. That is, the first diffusion region 67n and the gate electrode 22e of the amplification transistor 22 are electrically connected to each other via the contact plugs cp1 and cp6, the plugs pa1 and pa2, and the wiring layer 80b.

The wiring layer 80b is arranged inside the insulating layer 90a and can include, as part, the vertical signal line 35, the address signal line 34, the piece 32 of power-supply wiring, the reset signal line 36, the feedback line 53, and the like described above. The vertical signal line 35, the address signal line 34, the piece 32 of power-supply wiring, the reset signal line 36, and the feedback line 53 are connected to the n-type impurity region 68dn, the gate electrode 24e, the n-type impurity region 68bn, the gate electrode 26e, and the second diffusion region 68an via the contact plugs cp4, cp7, cp3, cp5, and cp2, respectively.

The plug pb arranged inside the insulating layer 90b connects the wiring layer 80b to the wiring layer 80c. Similarly, the plug pc arranged inside the insulating layer 90c connects the wiring layer 80c to the wiring layer 80d. The plug pd arranged inside the insulating layer 90d connects the wiring layer 80d to the pixel electrode 12a of the photoelectric converter 12. The wiring layers 80b to 80d and the plugs pa1, pa2, and pb to pd are typically made of a metal, such as copper or tungsten, a metal compound, such as a metal nitride or a metal oxide, or the like.

The plugs pa1, pa2, and pb to pd, the wiring layers 80b to 80d, and the contact plugs cp1 and cp6 electrically connect the photoelectric converter 12 to the signal detection circuit 14 formed on the semiconductor substrate 60. The plugs pa1, pa2, and pb to pd, the wiring layers 80b to 80d, the contact plugs cp1 and cp6, the pixel electrode 12a of the photoelectric converter 12, the gate electrode 22e of the amplification transistor 22, and the first diffusion region 67n store signal charges (holes here) generated by the photoelectric converter 12.

Focus here on the n-type impurity regions formed in the semiconductor substrate 60. Of the n-type impurity regions formed in the semiconductor substrate 60, the first diffusion region 67n is arranged inside the p-type impurity region 66p that is formed inside the p-type semiconductor layer 65p as a p well. The first diffusion region 67n is formed near a surface of the semiconductor substrate 60, and at least a part thereof is located at the surface of the semiconductor substrate 60. A junction capacitance formed by a pn junction between the p-type impurity region 66p and the first diffusion region 67n functions as a capacitance which stores at least a part of signal charges and constitutes a part of a charge storage region.

In the configuration illustrated in FIG. 4, the first diffusion region 67n includes a first region 67a and a second region 67b. An impurity concentration in the first region 67a of the first diffusion region 67n is lower than the impurity concentrations in the second diffusion region 68an and the different n-type impurity regions 68bn to 68dn. The second region 67b in the first diffusion region 67n is formed inside the first region 67a and has an impurity concentration higher than that of the first region 67a. The contact hole h1 is located on the second region 67b, and the contact plug cp1 is connected to the second region 67b via the contact hole h1.

As described above, the arrangement of the p-type semiconductor layer 65p adjacent to the p-type semiconductor layer 63p allows control of the potential of the p-type semiconductor layer 65p via the p-type semiconductor layer 63p when the imaging device 100A is in operation. Adoption of this structure allows arrangement of regions lower in impurity concentration (the first region 67a of the first diffusion region 67n and the p-type impurity region 66p here) around a portion (the second region 67b of the first diffusion region 67n here) where the contact plug cp1 having an electrical connection to the photoelectric converter 12 is in contact with the semiconductor substrate 60. Formation of the second region 67b in the first diffusion region 67n is not essential. However, the effect of inhibiting expansion of a depletion layer (depletion) around the connection between the contact plug cp1 and the semiconductor substrate 60 is obtained by making the impurity concentration in the second region 67b that is a connection between the contact plug cp1 and the semiconductor substrate 60 relatively high. The inhibition of depletion around a portion where the contact plug cp1 is in contact with the semiconductor substrate 60 allows a reduction in a leakage current due to a crystal defect (which may also be referred to as an interface state) in the semiconductor substrate 60 at an interface between the contact plug cp1 and the semiconductor substrate 60. The connection of the contact plug cp1 to the second region 67b having a relatively high impurity concentration achieves the effect of reducing contact resistance.

In the present example, the first region 67a, which is lower in impurity concentration than the second region 67b, intervenes between the second region 67b of the first diffusion region 67n and the p-type impurity region 66p and also intervenes between the second region 67b of the first diffusion region 67n and the p-type semiconductor layer 65p. The arrangement of the first region 67a, which is lower in impurity concentration, around the second region 67b allows a reduction in strength of an electric field produced by a pn junction between the first diffusion region 67n and the p-type semiconductor layer 65p or the p-type impurity region 66p. The reduction in electric field strength reduces a leakage current due to the electric field produced by the pn junction.

As schematically shown in FIG. 3, the pixel 10A includes an isolation region (hereinafter referred to as the element isolation region 69) which isolates the reset transistor 26 that includes the first diffusion region 67n and the second diffusion region 68an as the source and the drain from the different transistors (the amplification transistor 22 and the address transistor 24 here) that the pixel 10A includes. The element isolation region 69 contains, for example, an impurity of the second conductivity type (hereinafter referred to as p-type) different from n-type. In this case, the first diffusion region 67n and the element isolation region 69 formed around the first diffusion region 67n are arranged so as not to be in contact with each other at the surface of the semiconductor substrate 60.

More specifically, the first diffusion region 67n is formed inside the p-type impurity region 66p, which is lower in impurity concentration than the p-type semiconductor layer 65p. A depletion region is formed between the first diffusion region 67n and the p-type impurity region 66p. Generally, a crystal defect density near the surface of the semiconductor substrate 60 is higher than a crystal defect density inside the semiconductor substrate 60. For this reason, among the depletion region formed at a junction (that is, the pn junction) where the first diffusion region 67n and the p-type impurity region 66p join together, a leakage current of a depletion region formed near the surface of the semiconductor substrate 60 is larger than a leakage current of a depletion region formed inside the semiconductor substrate 60.

If an area of a depletion region (hereinafter referred to as an interface depletion layer) formed at the junction at the surface of the semiconductor substrate 60 increases, a leakage current is likely to increase. For this reason, the area of the interface depletion layer exposed at the surface of the semiconductor substrate 60 is desirably minimized. To reduce the area of the interface depletion layer, the first diffusion region 67n may be formed such that an area thereof is smaller than an area of the second diffusion region 68an when viewed from the direction perpendicular to the semiconductor substrate 60. For example, the area of the first diffusion region 67n may be not more than ½ of that of the second diffusion region 68an when viewed from the direction perpendicular to the semiconductor substrate 60. In this case, a width in a channel width direction of the first diffusion region 67n may be not more than ½ of a width in the channel width direction of the second diffusion region 68an. Note that the first diffusion region 67n and the second diffusion region 68an may be equal in either one of a width in the channel width direction and a length in a channel length direction. The same applies to the different n-type impurity regions 68bn to 68dn inside the pixel 10A. The first diffusion region 67n may be formed such that the area thereof is smaller than areas of the different n-type impurity regions 68bn to 68dn when viewed in the direction perpendicular to the semiconductor substrate 60.

Areas of respective portions, which do not overlap with the gate electrode 26e of the reset transistor 26 when viewed from the direction perpendicular to the semiconductor substrate 60, of the first diffusion region 67n and the second diffusion region 68an may be regarded as the above-described areas of the first diffusion region 67n and the second diffusion region 68an. Similarly, areas of respective portions, which do not overlap with the gate electrode 22e of the amplification transistor 22 and the gate electrode 24e of the address transistor 24 when viewed from the direction perpendicular to the semiconductor substrate 60, of the different n-type impurity regions 68bn to 68dn may be regarded as the areas of the different n-type impurity regions 68bn to 68dn. When viewed from the direction perpendicular to the semiconductor substrate 60, portions, which overlap with the gate electrodes 22e, 24e, and 26e of the transistors, are less likely to be damaged at the time of manufacture than the portions, which do not overlap with the gate electrodes 22e, 24e, and 26e. Examples of the damage at the time of manufacture include damage caused by plasma processing used in a dry etching process and damage caused by ashing at the time of resist peeling. As is clear from this, a leakage current is unlikely to be generated in the portions, which overlap with the gate electrodes 22e, 24e, and 26e. Thus, to reduce the area of the interface depletion layer, only effects of the areas of the portions, which do not overlap with the gate electrodes, of the first diffusion region 67n and the different n-type impurity regions 68bn to 68dn may be taken into consideration.

A reduction in the area of the first diffusion region 67n makes a distance between the contact hole h1 formed on the first diffusion region 67n and the gate electrode 26e smaller than, for example, a distance between the contact hole h2 formed on the second diffusion region 68an and the gate electrode 26e. That is, when viewed from the direction perpendicular to the semiconductor substrate 60, a distance of a connection between the contact plug cp1 and the first diffusion region 67n from the gate electrode 26e is smaller than a distance of a connection between the contact plug cp2 and the second diffusion region 68an from the gate electrode 26e. As described above, the first diffusion region 67n has a low impurity concentration and thus has a resistance value larger than that of the second diffusion region 68an. The reduction in the distance between the contact hole h1 and the gate electrode 26e shortens a current path in the first diffusion region 67n, which reduces the resistance value in the first diffusion region 67n. Note that the same applies to the different n-type impurity regions 68bn and 68dn and that the distance between the contact hole h1 formed on the first diffusion region 67n and the gate electrode 26e may be smaller than distances between the contact holes h3 and h4 formed on the n-type impurity regions 68bn and 68dn and the gate electrodes 22e and 24e. That is, when viewed from the direction perpendicular to the semiconductor substrate 60, the distance of the connection between the contact plug cp1 and the first diffusion region 67n from the gate electrode 26e may be smaller than a distance of a connection between the contact plug cp3 and the n-type impurity region 68bn from the gate electrode 22e. When viewed from the direction perpendicular to the semiconductor substrate 60, the distance of the connection between the contact plug cp1 and the first diffusion region 67n from the gate electrode 26e may be smaller than a distance of a connection between the contact plug cp4 and the n-type impurity region 68dn from the gate electrode 24e.

(First Modification)

Figure 5:
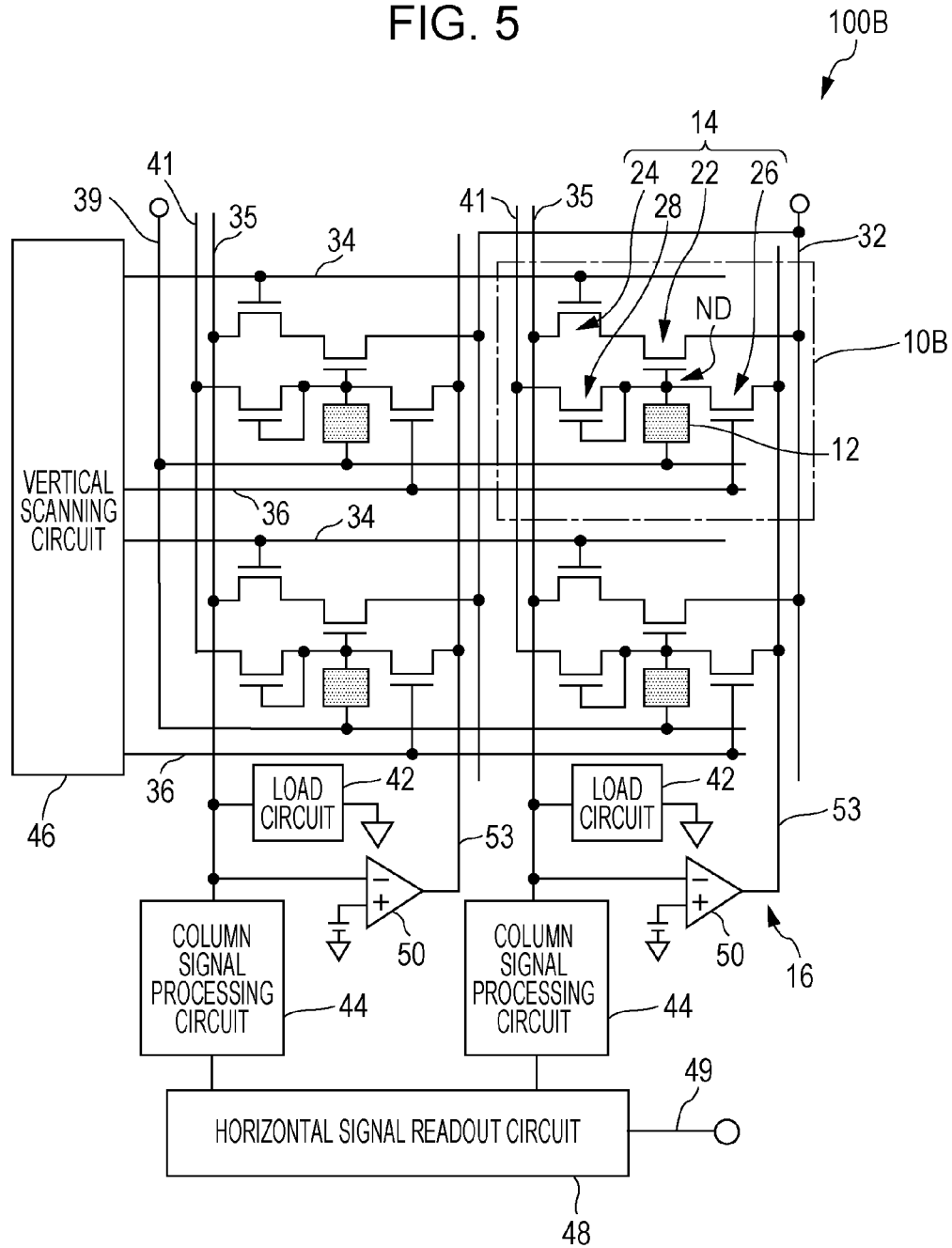
FIG. 5 is a diagram showing a circuit configuration of an imaging device according to a first modification of the embodiment.

FIG. 5 is a diagram showing a circuit configuration of an imaging device 100B according to a first modification of the present embodiment. A main difference between a pixel 10B shown in FIG. 5 and the pixel 10A shown in FIG. 2 is that an over-voltage protection transistor 28 is formed on the semiconductor substrate 60. A description will be given below with a focus on differences from the embodiment, and a detailed description of common points will be omitted.

As shown in FIG. 5, the charge storage node ND electrically connects a drain of the reset transistor 26, a gate of the amplification transistor 22, a lower electrode of the photoelectric converter 12, and a source and a gate of the over-voltage protection transistor 28. The drain of the reset transistor 26 here is the first diffusion region 67n that is a charge storage region. The source of the over-voltage protection transistor 28 is connected to a piece of VDD wiring or a power-supply line 41 dedicated to the over-voltage protection transistor 28. When excessive light is incident on the photoelectric conversion film 12b, a potential of the first diffusion region 67n may exceed a power-supply voltage VDD. Excessive charges can be allowed to escape from the first diffusion region 67n to the power-supply line 41 by making settings such that a threshold voltage of the over-voltage protection transistor 28 is turned on when the potential of the first diffusion region 67n becomes equal to the power-supply voltage VDD. This results in prevention of a failure, such as seizure.

Figure 6:
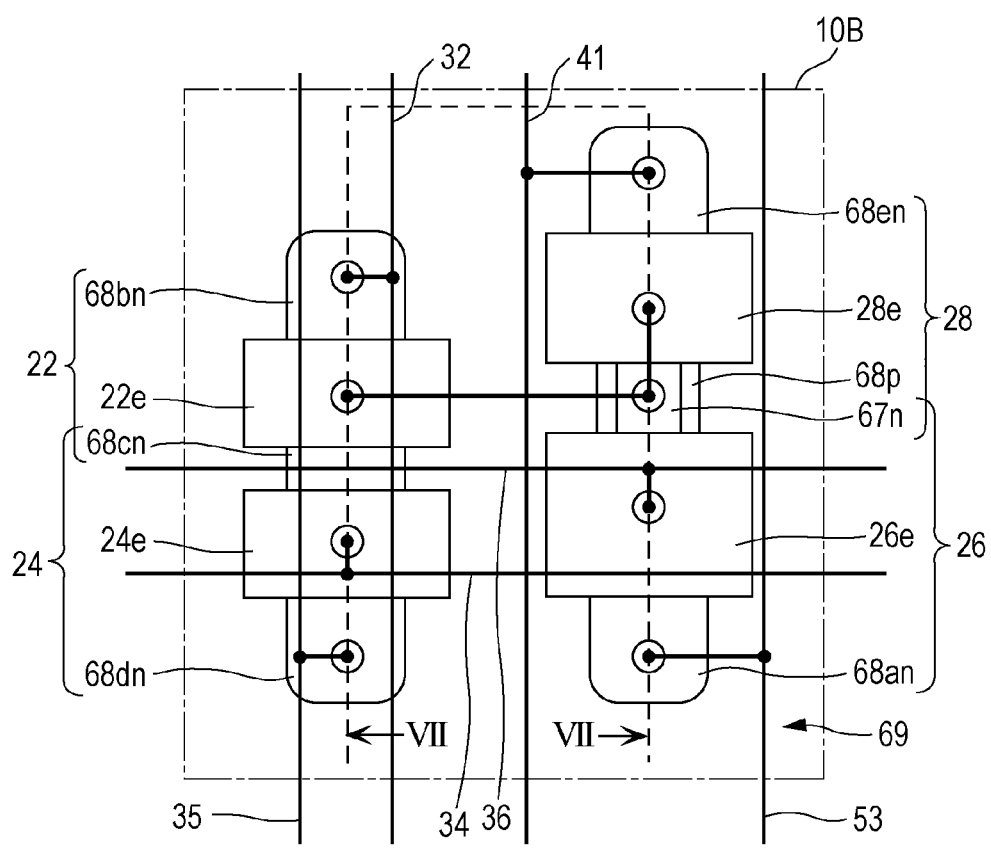
FIG. 6 is a plan view showing a layout inside a pixel according to the first modification of the embodiment.

FIG. 6 is a plan view showing a layout inside the pixel 10B according to the first modification of the present embodiment. As shown in FIG. 6, the pixel 10B according to the present modification further includes a third transistor (the over-voltage protection transistor 28 here) which is different from a first transistor (the reset transistor 26 here). The over-voltage protection transistor 28 includes a gate electrode 28e, a source region, and a drain region. The first diffusion region 67n here functions as the drain region of the over-voltage protection transistor 28. Note that the first diffusion region 67n also functions as a drain region of the reset transistor 26. As described above, the two transistors share the first diffusion region 67n as the respective drain regions. An n-type impurity region 68en functions as the source region of the over-voltage protection transistor 28.

An n-type impurity concentration in the first diffusion region 67n may be lower than an n-type impurity concentration in the n-type impurity region 68en. This makes the n-type impurity concentration in the first diffusion region 67n lower than n-type impurity concentrations in the different n-type impurity regions 68bn to 68en inside the pixel 10B. Since this reduces a junction concentration between the first diffusion region 67n and the semiconductor substrate 60, a leakage current can be reduced.

Figure 7:
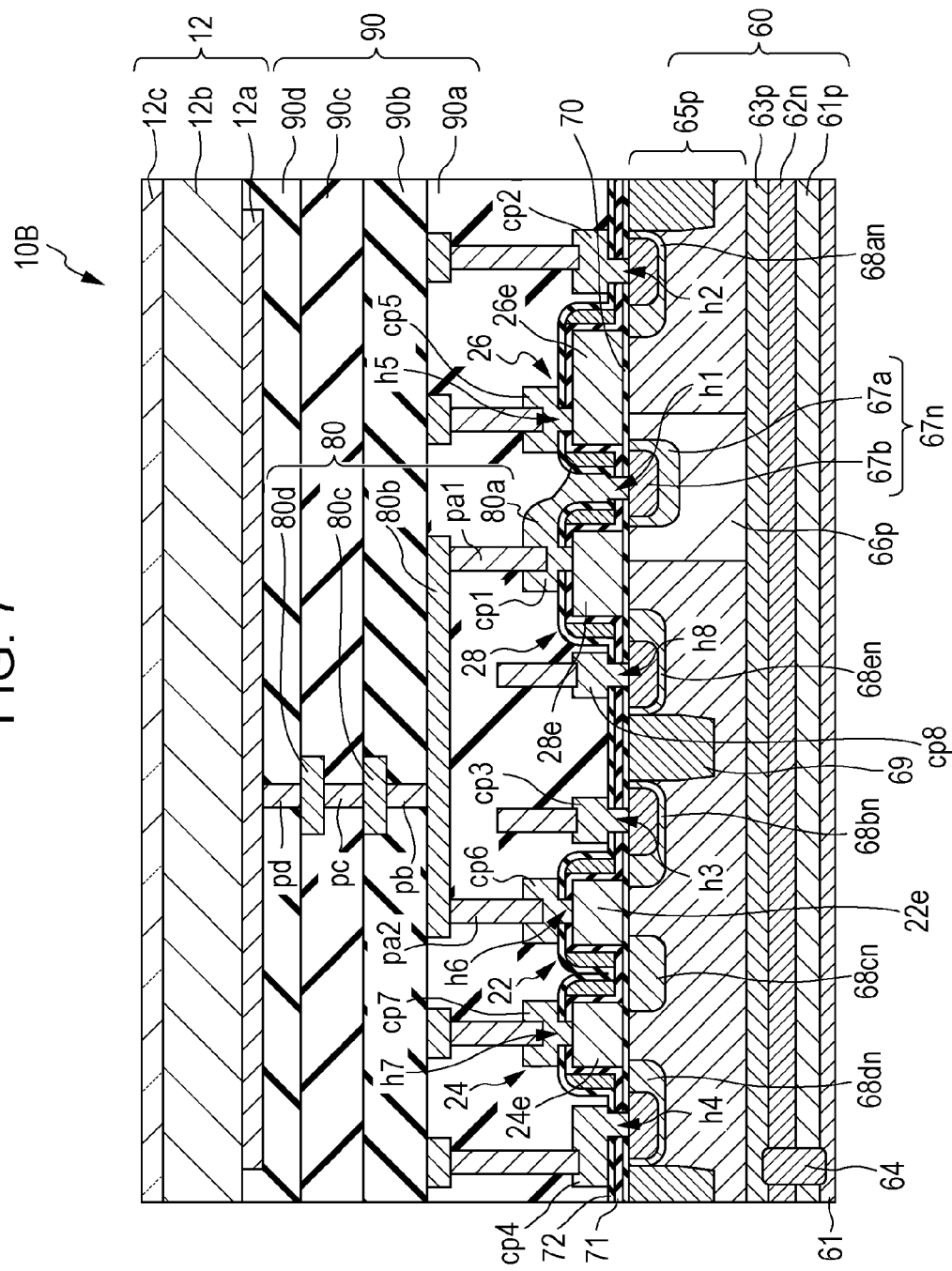
FIG. 7 is a schematic cross-sectional view of a device structure of the pixel according to the first modification of the embodiment.

FIG. 7 is a cross-sectional view of a device structure in a case where the pixel 10B is cut along line VII-VII in FIG. 6 and is developed in directions indicated by arrows. As shown in FIG. 7, the gate electrode 28e of the over-voltage protection transistor 28 is formed on the semiconductor substrate 60 via the insulating layer 70. The n-type impurity region 68en is formed at a surface of the semiconductor substrate 60.

When excessive light is incident on the photoelectric conversion film 12b, the potential of the first diffusion region 67n rises to be about equal to a bias voltage applied to the transparent electrode 12c. When such an overvoltage is applied to the first diffusion region 67n, the first diffusion region 67n may break or the insulating layer 70 of the amplification transistor 22 may break. This results in occurrence of a failure, such as seizure.

According to the present modification, it is possible to reduce a dark current and prevent transistors from failing due to an overvoltage even if excessive light is incident.

(Second Modification)

Figure 8:
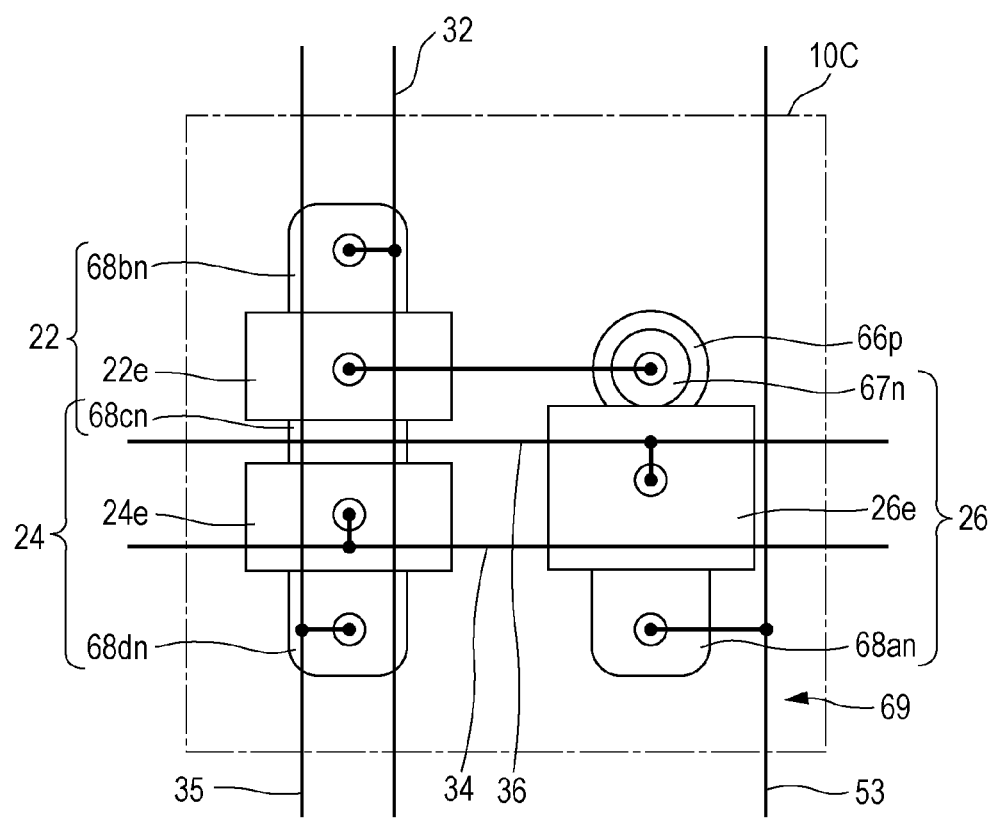
FIG. 8 is a plan view showing a layout inside a pixel according to a second modification of the embodiment.

FIG. 8 is a plan view showing a layout inside a pixel 10C in an imaging device 100C according to a second modification of the present embodiment. The pixel 10C according to the present modification is different from the pixel 10A in that the first diffusion region (FD) 67n is circular when viewed from a direction perpendicular to the semiconductor substrate 60. A description will be given below with a focus on differences from the embodiment, and a detailed description of common points will be omitted.

In the present modification, the first diffusion region (FD) 67n is circular when viewed from the direction perpendicular to the semiconductor substrate 60, as described above. For this reason, an area at a surface of the semiconductor substrate 60 of the first diffusion region 67n is smaller than in a case where the first diffusion region 67n is formed in a rectangular shape. This reduces an area of an interface depletion layer which is formed at a junction between the first diffusion region 67n and the semiconductor substrate 60 at the surface of the semiconductor substrate 60. Thus, a leakage current at the junction can be reduced.

Note that although the over-voltage protection transistor 28 is not provided in the present modification, as in the imaging device 100A according to the embodiment, the over-voltage protection transistor 28 may be provided, as in the imaging device 100B according to the first modification. This allows transistors to be prevented from failing due to an overvoltage even if excessive light is incident on the photoelectric converter 12.

(Third Modification)

Figure 9:
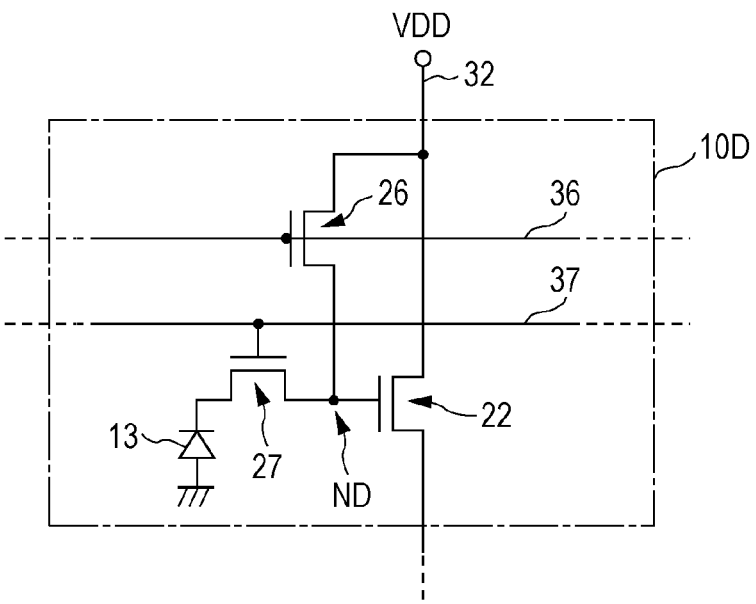
FIG. 9 is a diagram showing a circuit configuration of a pixel according to a third modification of the embodiment.
Figure 10:
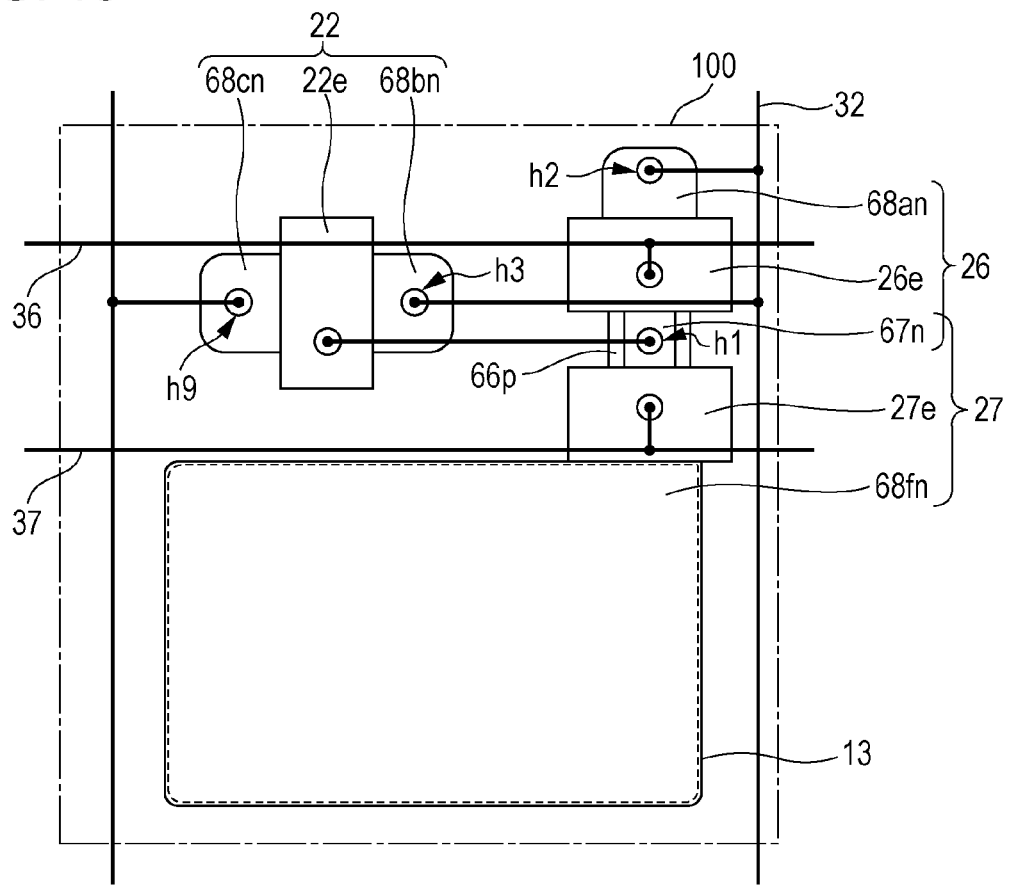
FIG. 10 is a plan view showing a layout inside the pixel according to the third modification of the embodiment.

FIG. 9 is a diagram showing a circuit configuration of a pixel 10D in an imaging device 100D according to a third modification of the present embodiment. FIG. 10 is a plan view showing a layout inside the pixel 10D according to the present modification. Although an imaging device including a photoelectric converter using a photoelectric conversion film has been described as an example in each of the embodiment and modifications described above, the present modification will describe, as an example, an imaging device using a photodiode as a photoelectric converter.

As shown in FIGS. 9 and 10, the pixel 10D according to the present modification includes a photodiode 13 and a transfer transistor 27. The photodiode 13 includes an n-type impurity region 68fn and a pinning layer (not shown) which is located on an upper side of the n-type impurity region 68fn. The pinning layer is a p-type impurity region. The photodiode 13 photoelectrically converts light received during an exposure time to generate charges. After the predetermined exposure time, a transfer signal for turning on the transfer transistor 27 is applied to a gate of the transfer transistor 27 via a transfer signal line 37. This turns on the transfer transistor 27, and the charges generated by the photodiode 13 are transferred to the charge storage node ND. The amplification transistor 22 outputs a signal corresponding to the charges transferred to the charge storage node ND to the vertical signal line 35 (not shown). The signal output to the vertical signal line 35 is supplied to an AD converter (not shown) and is AD-converted.

As shown in FIG. 10, the transfer transistor 27 includes the first diffusion region 67n and the n-type impurity region 68fn as a source and a drain. The transfer transistor 27 also includes a gate electrode 27e. The transfer transistor 27 shares the first diffusion region 67n with the reset transistor 26, as one of the source and the drain.

As shown in FIG. 9, the charge storage node ND electrically connects a drain of the reset transistor 26, a gate of the amplification transistor 22, and the source of the transfer transistor 27. The drain of the reset transistor 26 in FIG. 10 here is the first diffusion region 67n that is a charge storage region.

In the present modification, the pixel 10D includes a first transistor (the reset transistor 26 here), like the embodiment and modifications described above. The first transistor is located in the semiconductor substrate 60, and contains an n-type impurity. The first transistor also includes the first diffusion region 67n that stores charges obtained through conversion by the photodiode 13 as one of a source and a drain, and includes the second diffusion region 68an that is an n-type impurity region containing the n-type impurity as the other of the source and the drain. In this case, a concentration of the n-type impurity in the first diffusion region 67n is lower than that of the n-type impurity in the second diffusion region 68an. Since this reduces a junction concentration at a junction between the first diffusion region 67n and the semiconductor substrate 60, a leakage current in the first diffusion region 67n is reduced.

The pixel 10D further includes a second transistor (the amplification transistor 22 here) which is different from the reset transistor 26. The second transistor is located in the semiconductor substrate 60 and includes a third diffusion region (hereinafter referred to as the different n-type impurity regions 68bn and 68cn) containing the n-type impurity as a source or a drain. In this case, the concentration of the n-type impurity in the first diffusion region 67n may be lower than concentrations of the n-type impurity in the different n-type impurity regions 68bn and 68cn. The concentration of the n-type impurity in the first diffusion region 67n may be lower than at least 1/10 of the concentrations of the n-type impurity in the second diffusion region 68an and the different n-type impurity regions 68bn and 68cn, or lower than 1/15. Since this reduces the junction concentration at the junction between the first diffusion region 67n and the semiconductor substrate 60, electric field strength at the junction can be reduced. For this reason, a leakage current from or to the first diffusion region 67n that is a charge storage region can be reduced.

In the imaging device 100D according to the present modification, the semiconductor substrate 60 may contain a p-type impurity, and the concentration of the n-type impurity contained in the first diffusion region 67n and a concentration of the p-type impurity contained in a portion adjacent to the first diffusion region 67n of the semiconductor substrate 60 may be not less than $1 \times 10^{16}$ atoms/cm$^3$ and not more than $5 \times 10^{16}$ atoms/cm$^3$. This reduces the junction concentration between the first diffusion region 67n and the semiconductor substrate 60, which can curb a rise in electric field strength at the junction. For this reason, a leakage current at the junction can be reduced.

If an area of a depletion region (hereinafter referred to as an interface depletion layer) which is formed at a junction at a surface of the semiconductor substrate 60 increases, a leakage current is likely to increase. For this reason, the area of the interface depletion layer exposed at the surface of the semiconductor substrate 60 is desirably minimized. To reduce the area of the interface depletion layer, the first diffusion region 67n may be formed such that an area thereof is smaller than an area of the second diffusion region 68an when viewed from a direction perpendicular to the semiconductor substrate 60. For example, the area of the first diffusion region 67n may be not more than ½ of that of the second diffusion region 68an when viewed from the direction perpendicular to the semiconductor substrate 60. In this case, a width in a channel width direction of the first diffusion region 67n may be not more than ½ of a width in the channel width direction of the second diffusion region 68an. Note that the first diffusion region 67n and the second diffusion region 68an may be equal in either one of a width in the channel width direction and a length in a channel length direction. The same applies to the different n-type impurity regions 68bn and 68cn inside the pixel 10D. The first diffusion region 67n may be formed such that the area thereof is smaller than areas of the different n-type impurity regions 68bn and 68cn when viewed from the direction perpendicular to the semiconductor substrate 60.

Areas of respective portions, which do not overlap with the gate electrode 26e of the reset transistor 26, of the first diffusion region 67n and the second diffusion region 68an when viewed from the direction perpendicular to the semiconductor substrate 60 may be regarded as the above-described areas of the first diffusion region 67n and the second diffusion region 68an. Similarly, areas of respective portions, which do not overlap with the gate electrode 22e of the amplification transistor 22, of the different n-type impurity regions 68bn and 68cn when viewed from the direction perpendicular to the semiconductor substrate 60 may be regarded as the areas of the different n-type impurity regions 68bn and 68cn. When viewed from the direction perpendicular to the semiconductor substrate 60, portions, which overlap with the gate electrodes 22e and 26e of the transistors, are less likely to be damaged at the time of manufacture than the portions, which do not overlap with the gate electrodes 22e and 26e. Examples of the damage at the time of manufacture include damage caused by plasma processing used in a dry etching process and damage caused by ashing at the time of resist peeling. As is clear from this, a leakage current is unlikely to be generated in the portions, which overlap with the gate electrodes 22e and 26e. Thus, to reduce the area of the interface depletion layer, only effects of the areas of the portions, which do not overlap with the gate electrodes, of the first diffusion region 67n and the different n-type impurity regions 68bn and 68cn may be taken into consideration.

A reduction in the area of the first diffusion region 67n makes a distance between the contact hole h1 formed on the first diffusion region 67n and the gate electrode 26e smaller than, for example, a distance between the contact hole h2 formed on the second diffusion region 68an and the gate electrode 26e. As described above, the first diffusion region 67n has a low impurity concentration and thus has a resistance value larger than that of the second diffusion region 68an. The reduction in the distance between the contact hole h1 and the gate electrode 26e shortens a current path in the first diffusion region 67n, which reduces the resistance value in the first diffusion region 67n. Note that the same applies to the different n-type impurity regions 68bn and 68cn and that the distance between the contact hole h1 formed on the first diffusion region 67n and the gate electrode 26e may be smaller than distances between contact holes h3 and h9 formed on the n-type impurity regions 68bn and 68cn and the gate electrode 22e.

An imaging device according to the present disclosure has been described above on the basis of the embodiment and modifications. The present disclosure, however, is not limited to the embodiment and modifications. Forms obtained by making various modifications, which occur to those skilled in the art, to the embodiment and modifications and different forms obtained by combining some constituent elements in the embodiment and modifications are also included in the scope of the present disclosure as long as the forms do not depart from the spirit of the present disclosure.

According to the embodiment and modifications of the present disclosure, since effects of a leakage current can be reduced, an imaging device capable of image pickup with high image quality is provided. Note that each of the amplification transistor 22, the address transistor 24, the reset transistor 26, and the over-voltage protection transistor 28 described above may be an N-channel MOS or a P-channel MOS. If each transistor is a P-channel MOS, an impurity of a first conductivity type is a p-type impurity, and an impurity of a second conductivity type is an n-type impurity. The transistors need not be all N-channel MOSs or P-channel MOSs. If N-channel MOSs are used as transistors inside a pixel, and an electron is used as a signal charge, positions of a source and a drain in each of the transistors may be interchanged.

According to the present disclosure, an imaging device capable of reducing effects of a dark current and performing image pickup with high image quality is provided. The imaging device according to the present disclosure is useful as, for example, an image sensor or a digital camera. The imaging device according to the present disclosure can be used in a medical camera, a robot camera, a security camera, a camera used mounted on a vehicle, and the like.

What is claimed is:
1. An imaging device comprising:
a pixel that includes
a semiconductor substrate including
a first diffusion region containing a first impurity of a first conductivity type, and
a second diffusion region containing a second impurity of the first conductivity type, a concentration of the first impurity in the first diffusion region being less than a concentration of the second impurity in the second diffusion region, an area of the first diffusion region being less than an area of the second diffusion region in a plan view,
a photoelectric converter configured to convert light into charges, and
a first transistor including a first source and a first drain, the first diffusion region functioning as one of the first source and the first drain, the second diffusion region functioning as the other of the first source and the first drain, the first diffusion region being configured to store at least a part of the charges.
2. The imaging device according to claim 1, wherein the semiconductor substrate includes a third diffusion region containing a third impurity of the first conductivity type, the pixel includes a second transistor including a second source and a second drain, the third diffusion region functioning as one of the second source and the second drain, and the concentration of the first impurity in the first diffusion region is less than a concentration of the third impurity in the third diffusion region.

3. The imaging device according to claim 1, wherein the pixel includes a second transistor including a second source and a second drain, the first diffusion region functioning as one of the second source and the second drain.

4. The imaging device according to claim 1, wherein the first transistor includes a gate electrode, and an area of a first portion of the first diffusion region is less than an area of a second portion of the second diffusion region in the plan view, the first portion being a portion of the first diffusion region not overlapping with the gate electrode in the plan view, the second portion being a portion of the second diffusion region not overlapping with the gate electrode in the plan view.

5. The imaging device according to claim 1, wherein the pixel includes a first plug connected to a first portion of the first diffusion region, and a second plug connected to a second portion of the second diffusion region, the first transistor includes a gate electrode, and a distance between the first portion and the gate electrode is less than a distance between the second portion and the gate electrode in the plan view.

6. The imaging device according to claim 1, wherein the semiconductor substrate includes a third diffusion region containing a third impurity of a second conductivity type different from the first conductivity type, the pixel includes a second transistor different from the first transistor and an isolation region isolating the first transistor from the second transistor, the third diffusion region functioning as the isolation region, and the third diffusion region is not in contact with the first diffusion region on a surface of the semiconductor substrate.

7. The imaging device according to claim 1, wherein the semiconductor substrate contains a third impurity of a second conductivity type different from the first conductivity type, the concentration of the first impurity in the first diffusion region is $1\times10^{16}$ atoms/cm$^3$ or more and $5\times10^{16}$ atoms/cm$^3$ or less, and a concentration of the third impurity in a portion of the semiconductor substrate is $1\times10^{16}$ atoms/cm$^3$ or more and $5\times10^{16}$ atoms/cm$^3$ or less, the portion being adjacent to the first diffusion region.

8. The imaging device according to claim 1, wherein the first diffusion region is circular in the plan view.

9. An imaging device comprising:

a pixel that includes a semiconductor substrate including a first diffusion region containing a first impurity of a first conductivity type, and a second diffusion region containing a second impurity of the first conductivity type, a concentration of the first impurity in the first diffusion region being less than a concentration of the second impurity in the second diffusion region, a photoelectric converter configured to convert light into charges, a first transistor including a gate electrode, a first source and a first drain, the first diffusion region functioning as one of the first source and the first drain, the second diffusion region functioning as the other of the source and the drain, the first diffusion region being configured to store at least a part of the charges, a first plug connected to a first portion of the first diffusion region, and a second plug connected to a second portion of the second diffusion region, wherein a distance between the first portion and the gate electrode is less than a distance between the second portion and the gate electrode in a plan view.

10. The imaging device according to claim 1, wherein the semiconductor substrate includes a third diffusion region containing a third impurity of a second conductivity type different from the first conductivity type, and a bottom surface of the first diffusion region is in contact with the third diffusion region.

11. The imaging device according to claim 1, wherein a width of the first diffusion region is less than a width of the second diffusion region in a channel width direction of the first transistor.

12. An imaging device comprising:

a pixel that includes a semiconductor substrate including a first diffusion region containing a first impurity of a first conductivity type, a second diffusion region containing a second impurity of the first conductivity type, an area of the first diffusion region being less than an area of the second diffusion region in a plan view, and an impurity region containing a third impurity of a second conductivity type different from the first conductivity type, a bottom surface of the first diffusion region being in contact with the impurity region, a photoelectric converter configured to convert light into charges, and a first transistor including a first source and a first drain, the first diffusion region functioning as one of the first source and the first drain, the second diffusion region functioning as the other of the first source and the first drain, the first diffusion region being configured to store at least a part of the charges.

13. The imaging device according to claim 12, wherein a width of the first diffusion region is less than a width of the second diffusion region in a channel width direction of the first transistor.

* * * * *